United States Patent [19]

Bauman

[11] 4,379,994

[45] Apr. 12, 1983

[54] FEED-FORWARD AMPLIFIER

[75] Inventor: Ronald M. Bauman, Washington, D.C.

[73] Assignee: The United States of America as represented by the Secretary of the Navy, Washington, D.C.

[21] Appl. No.: 244,175

[22] Filed: Mar. 16, 1981

[51] Int. Cl.$^3$ .............................................. H03F 1/26
[52] U.S. Cl. ..................................... 330/149; 330/84; 330/151
[58] Field of Search ..................... 330/84, 124 R, 149, 330/151

[56] References Cited

U.S. PATENT DOCUMENTS

| | | | |
|---|---|---|---|
| 3,360,739 | 12/1967 | Cooke-Yarborough | 330/84 X |
| 3,471,798 | 10/1969 | Seidel | 330/151 X |
| 3,922,617 | 11/1975 | Denniston et al. | 330/149 |
| 4,146,844 | 4/1979 | Quinn | 330/151 X |

Primary Examiner—James B. Mullins

[57] ABSTRACT

A feed-forward amplifier in which samples of the input and output signals of a main amplifier are adjusted in amplitude and algebraically combined to produce a sample of the error introduced into the output signal by distortion and noise in the main amplifier. This error sample is amplified to produce a correction signal by a subsidiary amplifier which itself introduces noise and distortion. The correction signal is algebraically combined with the output signal of the main amplifier and a fraction of the resultant output signal is fed back to the input of the subsidiary amplifier to render the output signal substantially free of error caused by either of the main and the subsidiary amplifiers.

10 Claims, 2 Drawing Figures

FEED-FORWARD AMPLIFIER

BACKGROUND OF THE INVENTION

This invention relates generally to amplifiers and more particularly to amplifiers with forward feed.

In a basic feed-forward system, such as described, for example, in U.S. Pat. No. 4,146,844 issued to P. A. Quinn on Mar. 27, 1979, samples of the input and output signals of a main amplifier are adjusted in amplitude and algebraically combined at a first summing node to produce a sample of the error (e.g., distortion and noise) introduced into the output signal by the main amplifier. This error sample is adjusted in amplitude and fed forward to a second summing node where it is algebraically combined with the output of the main amplifier to cancel the error in the output signal. In a typical feed-forward system, the error sample is adjusted in amplitude by amplification in a subsidiary amplifier which itself introduces noise and distortion. As a result, the output signal is accompanied by an output error component caused by the subsidiary amplifier which is of magnitude $NG_2$, where $G_2$ is the complex gain factor of the subsidiary amplifier, and N includes both the equivalent input noise voltage of the subsidiary amplifier as well as any other signals (referred to its input) arising from the non-linearity of the subsidiary amplifier. This output error component can in many cases be greater than the distortion and noise that the feed-forward loop was designed to eliminate.

U.S. Pat. No. 3,471,798, issued to H. Seidel on Oct. 7, 1969, discloses a multiple-loop feed-forward-compensated amplifier in which the feed-forward loop is iterated by considering the entire feed-forward amplifier to be the "main" amplifier which is to be feed-forward compensated. This modification provides compensation for error introduced by the subsidiary amplifier, but requires the addition to the circuit of a second subsidiary amplifier which itself can cause an intolerable output error component.

SUMMARY OF THE INVENTION

Accordingly, it is an object of the present invention to reduce the magnitude of the output error component of the output signal of a feed-forward amplifier.

Another object is to reduce the dependency of the output error component of the output signal of a feed-forward amplifier on the error introduced by the subsidiary amplifier.

A further object is to obtain an output signal from a feed-forward amplifier which is substantially free of error caused by both the main and subsidiary amplifiers.

The objects of the present invention are achieved by a feed-forward-compensated amplifier having a main amplifier channel which includes a main amplifier for receiving an input signal and producing an amplified signal therefrom. The outputs of the main amplifier channel and a feed-forward channel are coupled together in algebraic summing relationship by a coupling means to produce a resultant output signal. The feed-forward channel employs error means connected across the main amplifier's input and output for producing an error signal that is a function of the error introduced into the amplified signal by the main amplifier, and a subsidiary amplifier for producing a correction signal from the error signal, the correction signal being summed with the amplified signal in the coupling means to produce the output signal. Feedback means is provided for returning a fraction of the output signal to the subsidiary amplifier. The resultant output signal of the feed-forward amplifier is substantially free of error caused both by the main amplifier and by the subsidiary amplifier.

Additional advantages and features will become apparent as the subject invention becomes better understood by reference to the following detailed description when considered in connection with the accompanying drawings, wherein:

DESCRIPTION OF THE PREFERRED EMBODIMENT

Figure 1:
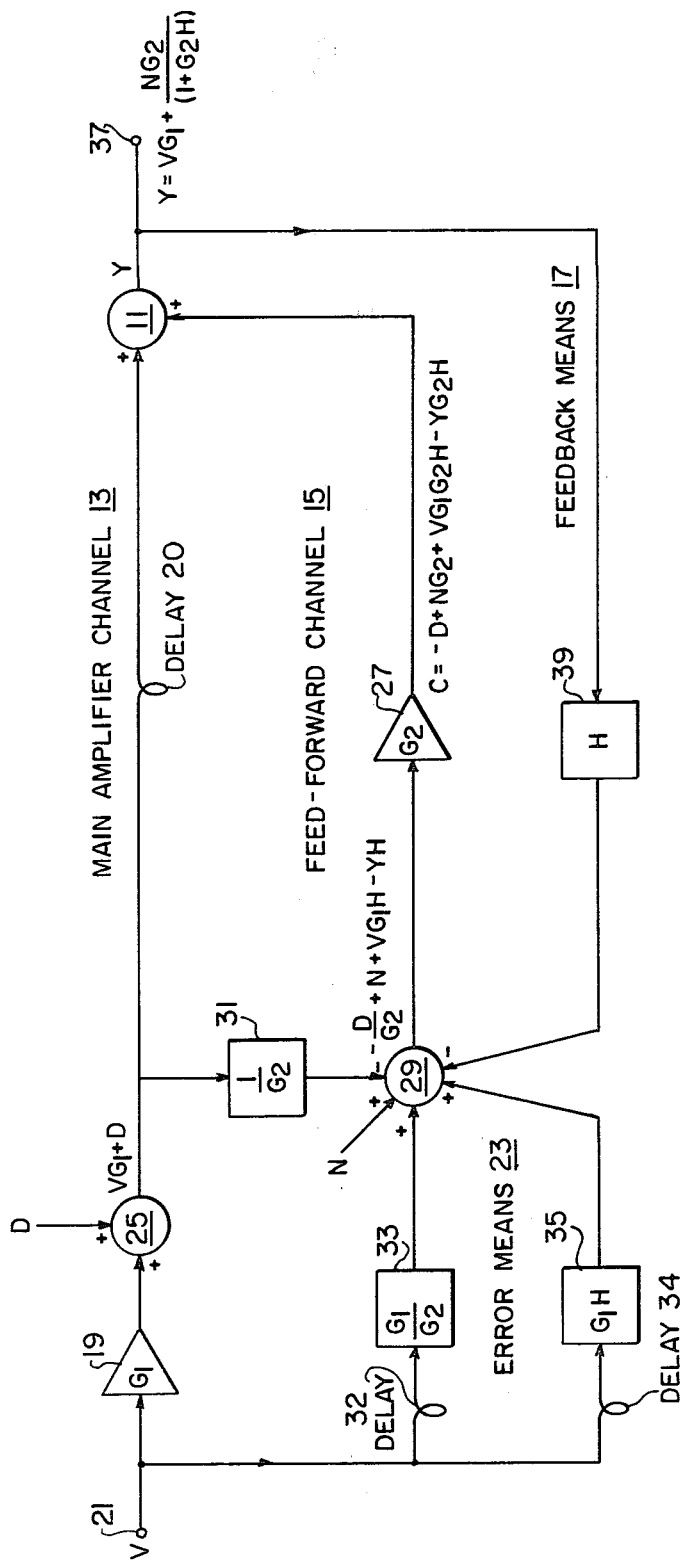
FIG. 1 shows a feed-forward-compensated amplifier circuit in accordance with the invention.

Referring now to the drawings wherein like reference characters refer to like or corresponding parts, FIG. 1 illustrates a feed-forward-compensated amplifier capable of providing a substantially error-free output signal.

The feed-forward amplifier includes coupling means 11, a main amplifier channel 13 whose output is connected as one input to the coupling means, a feed-forward channel 15 whose output is connected as the other input to the coupling means, and feedback means 17 connected between the output of the coupling means and the feed-forward channel.

The main amplifier channel 13 employs a main amplifier 19 which is connected to the input terminal 21 to receive an input signal V and which produces an amplified signal $VG_1$, where $G_1$ is the complex gain factor of the main amplifier. The output of the main amplifier 19 is connected by way of a time delay 20 as one input to the coupling means 11.

The feed-forward channel 15 includes error means 23 which is connected across the main amplifier 19 and which produces an error signal that is a function of the error introduced into the amplified input signal by the main amplifier. The term "error" as used herein shall be understood to include all spurious energy components including both noise and distortion components. The spurious energy components introduced by the main amplifier 19 are represented by a signal D shown adding to the otherwise perfectly linear output $VG_1$ at an equivalent summer 25 in the main amplifier channel.

While a variety of error means 23 may be provided, such means may conveniently take the form illustrated in FIG. 1 of a second coupling means 29, and three networks 31, 33 and 35, whose outputs are connected as inputs to the coupling means 29. Coupling means 29 which may be, for example, a summer, couples its inputs together in algebraic summing relationship to produce the error signal. The networks are characterized as follows: Network 31 whose input is connected to the output of the main amplifier 19 has a complex transfer function equal to $1/G_2$, where $G_2$ will be subsequently defined. Network 33 whose input is connected by way of a time delay 32 to the input of the main amplifier 19 has a complex transfer function equal to $G_1/G_2$. Network 35 whose input is also connected by way of a time delay 34 to the input of the main amplifier 19 has a complex transfer function equal to $G_1H$, where H is an arbitrary constant.

The feed-forward channel 15 also employs a subsidiary amplifier 27 having a complex gain factor $G_2$. The subsidiary amplifier 27 is connected to the output of coupling means 29 to receive the error signal. The subsidiary amplifier produces a correction signal from the error signal. In so doing, however, the subsidiary amplifier 27 introduces additional error represented by a signal N shown as another input to coupling means 29. The signal N includes both the equivalent input noise voltage of the subsidiary amplifier 27 as well as any other signals (referred to its input) which would not be present if the subsidiary amplifier were perfectly linear. The output of the subsidiary amplifier 27 is connected as the other input to the coupling means 11.

Coupling means 11 which may be, for example, a summer, couples its inputs together in algebraic summing relationship and provides them as the output signal Y to the output-terminal 37.

Feedback means 17 connected between the output of coupling means 11 and the coupling means 29, returns a fraction of the output signal to the input of the subsidiary amplifier 27. While a variety of feedback means 17 may be provided, such means may conveniently take the form illustrated in FIG. 1 of a network 39 whose input is connected to the output of coupling means 11 and whose output is coupled as an input to coupling means 29. Network 39 has a complex transfer function equal to H.

The time delay introduced by delay 20 is such that signals fed to coupling means 11 from the output of amplifier 19 by way of the path including time delay 20 or by way of the path including network 31, coupling means 29, and subsidiary amplifier 27, each appear at the input terminals of coupling means 11 in time coincidence. The time delay introduced by delay 32 is such that signals fed to coupling means 29 from input terminal 21 by way of the path including time delay 32 and network 33 or by way of the path including main amplifier 19 and network 31, each appear at the input terminals of coupling means 29 in time coincidence. The time delay introduced by delay 34 is such that signals fed to coupling means 29 from input terminal 21 by way of the path including time delay 34 and network 35 or by way of the path including main amplifier 19, time delay 20, coupling means 11, and network 39, each appear at the input terminals of coupling means 29 in time coincidence.

In operation, the input signal V at input terminal 21 is divided, part being fed to the main amplifier 19 to produce the signal $VG_1+D$. Another part is fed by way of time delay 32 and network 33 to a positive input terminal of coupling means 29 as a signal $VG_1/G_2$. The third part is fed by way of time delay 34 and network 35 to another positive input terminal of coupling means 29 as a signal $VG_1H$. A portion of the output from the main amplifier 19 is fed by way of network 31 to a negative input terminal of coupling means 29 as a signal $VG_1/G_2+D/G_2$. The remaining portion of the output from the main amplifier 19 is fed by way of time delay 20 to a positive input terminal of coupling means 11 and thence to output terminal 37 as the output signal Y. A portion of the output signal Y is fed back through network 39 to another negative input terminal of coupling means 29 as a signal YH. Coupling means 29 couples its inputs, including signal N, together in algebraic summing relationship to produce an error signal $-D/G_2+N+VG_1H-YH$ which is a function of the error D introduced into the amplified input signal by the main amplifier 19. The error signal is amplified in the subsidiary amplifier 27 to produce a correction signal $C=-D+NG_2+VG_1G_2H-YG_1H$ and fed to the other (positive) input of coupling means 11 in a manner to substantially cancel the errors caused by both the main and subsidiary amplifiers. Specifically, the correction signal C is summed with the amplified signal $VG_1+D$ to produce a compensated output signal $$Y = VG_1 + \frac{NG_2}{(1 + G_2H)}.$$

Note that the compensated output signal is expressed as the sum of the perfectly linear output $VG_1$ of the main amplifier and an output error component $(NG_2/1+G_2H)$ which is down by a factor of $(1+G_2H)$ from the error $NG_2$ associated with prior art feed-forward cicuits. The factor $(1+G_2H)$ can be made greater than 1 with practical values of amplifier gain factors and network transfer functions so that an output signal is obtained which is substantially free of error caused by both the main and subsidiary amplifiers.

Figure 2:
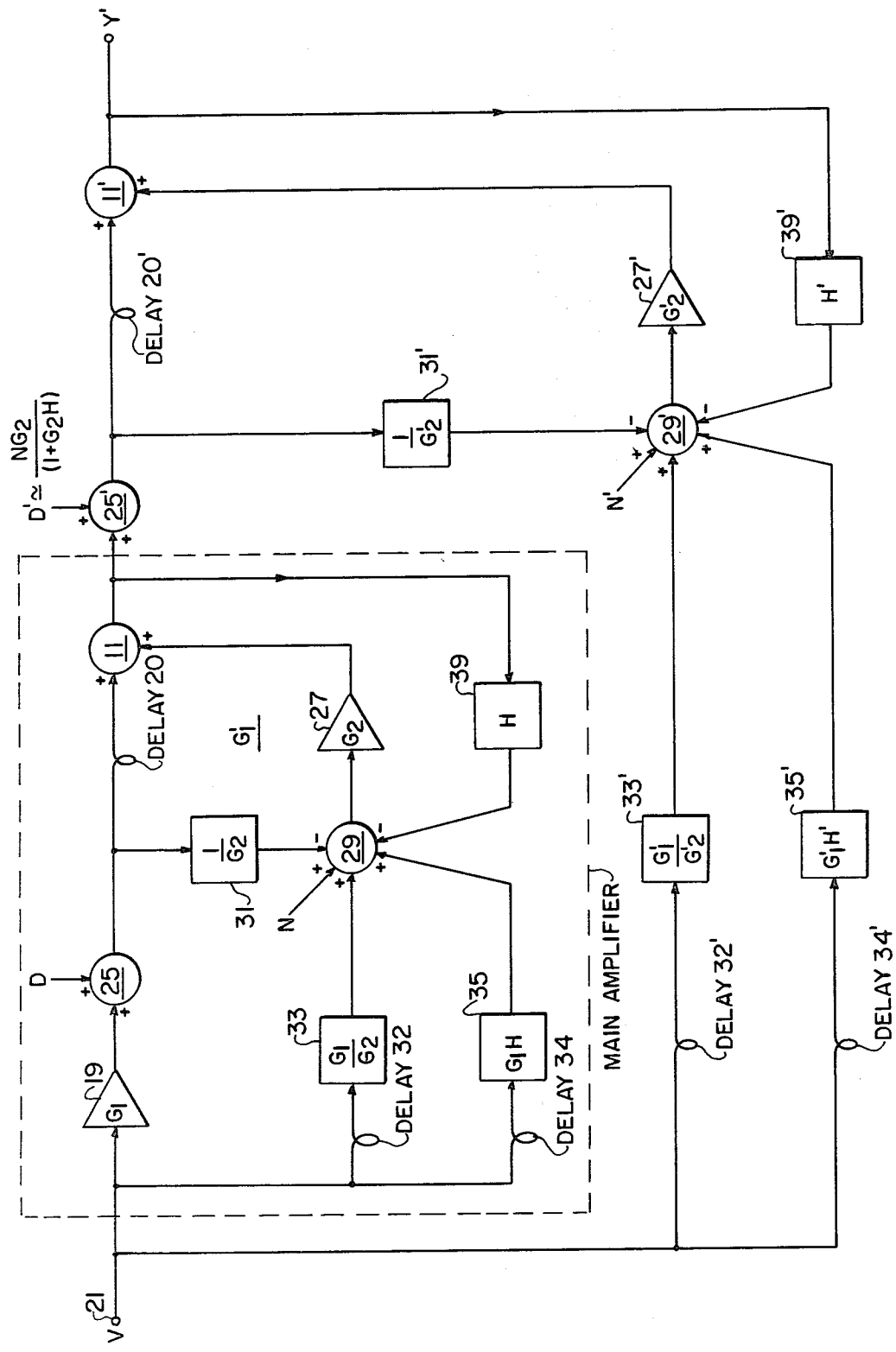
FIG. 2 shows a multiple-loop feed-forward amplifier circuit in accordance with the invention.

In practical implementation of the embodiment of FIG. 1, imperfect cancellation of error may occur at coupling means 11 if the complex transfer functions of networks 31, 33 and 35, which are functions of the amplifier gain factors, are not exactly equal to their required values. It is especially difficult to maintain the values of these transfer functions when error control is required over large percentage bandwidths. Accordingly, further error compensation can be achieved by means of multiple feed-forward amplifier circuits of the type shown in FIG. 2. In the embodiment of FIG. 2, the entire feed-forward-compensated amplifier of FIG. 1 is considered to be the "main" amplifier which is to be feed-forward-compensated. Otherwise the structure and operation of the multiple loop amplifier of FIG. 2 is the same as outlined above in connection with FIG. 1.

Obviously, numerous modifications and variations of the present invention are possible in light of the above teachings. For example, in the multiple feed-forward circuit shown in FIG. 2, only one feed-forward-compensated amplifier is used for the "main" amplifier which is to be feed-forward-compensated. It is to be understood, however, that additional iterations of the feed-forward amplifier of FIG. 1 can be carried out as many times as desired, or as practical, to achieve further error compensation. Thus, for example, the entire feed-forward-compensated amplifier of FIG. 2 can be considered to be the "main" amplifier 19 of FIG. 1. Further, many changes in the locations of the networks, time delays and coupling means can be effected provided that the required error signal is obtained. Thus, for example, networks 33 and 35 can be combined into a single equivalent network, or coupling means 29 can be decomposed into more than one coupling means, all feeding a single coupling means at the input to the subsidiary amplifier 27. It is therefore to be understood that within the scope of the appended claims, the invention may be practiced otherwise than as specifically described herein.

What is claimed as new and desired to be secured by Letters Patent of the United States is:

1. A feed-forward-compensated amplifier comprising:
   a main amplifier channel including a main amplifier for receiving an input signal and producing an amplified signal therefrom;
   a feed-forward channel including error means connected to the input and the output of the main amplifier for producing an error signal which is a function of the error introduced into the amplified input signal by the main amplifier, and a subsidiary amplifier connected to the error means for receiving the error signal and producing a correction signal therefrom;
   first coupling means for coupling a plurality of inputs together in algebraic summing relationship,
   the output of the feed-forward channel and the output of the main amplifier channel being connected as inputs to the first coupling means so that the correction signal is summed with the amplified signal to produce a feed-forward-compensated output signal; and
   feedback means connected to the output of the first coupling means for returning a fraction of the output signal to the input of the subsidiary amplifier,
   whereby an output signal is obtained which is substantially free of error caused by both the main and the subsidiary amplifiers.

2. The feed-forward amplifier recited in claim 1 wherein the error means includes:
   second coupling means for coupling a plurality of inputs together in algebraic summing relationship; and
   a network having a complex transfer function equal to the reciprocal of the complex gain factor of the subsidiary amplifier,
   the input of the network being connected to the output of the main amplifier, and the output of the network being connected as one input to the second coupling means.

3. The feed-forward amplifier recited in claim 2 wherein the error means includes:
   another network having a complex transfer function equal to the product of the complex gain factor of the main amplifier and the reciprocal of the complex gain factor of the subsidiary amplifier,
   the input of the other network being connected to the input of the main amplifier.

4. The feed-forward amplifier recited in claim 2 wherein the error means includes:
   another network having a complex transfer function equal to the product of an arbitrary constant and the complex gain factor of the main amplifier,
   the input of the other network being connected to the input of the main amplifier.

5. The feed-forward amplifier recited in claim 2 wherein the feedback means includes:
   another network having a complex transfer function equal to an arbitrary constant,
   the input of the other network being connected to the output of the first coupling means.

6. The feed-forward amplifier recited in claim 4 wherein the feedback means includes:
   a third network having a complex transfer function equal to the arbitrary constant,
   the input of the third network being connected to the output of the first coupling means.

7. The feed-forward amplifier recited in claim 1 wherein the error means includes:
   second coupling means for coupling a plurality of inputs together in algebraic summing relationship; and
   a first network having a complex transfer function equal to the reciprocal of the complex gain factor of the subsidiary amplifier,
   the input of the first network being connected to the output of the main amplifier, and the output of the first network being connected as one input to the second coupling means;
   a second network having a complex transfer function equal to the product of the complex gain factor of the main amplifier and the reciprocal of the complex gain factor of the subsidiary amplifier,
   the input of the second network being connected to the input of the main amplifier, and the output of the second network being connected as a second input to the second coupling means; and
   a third network having a complex transfer function equal to the product of an arbitrary constant and the complex gain factor of the main amplifier,
   the input of the third network being connected to the input of the main amplifier, and the output of the third network being connected as a third input to the second coupling means.

8. The feed-forward amplifier recited in claim 7 wherein the feedback means includes:
   a fourth network having a complex transfer function equal to the arbitrary constant,
   the input of the fourth network being connected to the output of the first coupling means and the output of the fourth network being connected as a fourth input to the second coupling means.

9. The feed-forward amplifier recited in claim 1 wherein:
   the main amplifier is itself a feed-forward amplifier in accordance with claim 1.

10. The feed-forward amplifier recited in claim 1 wherein the first coupling means includes:
    a summer.

* * * * *